US005281845A

United States Patent [19]

Wang et al.

[11] Patent Number: 5,281,845

[45] Date of Patent: Jan. 25, 1994

[54] PTCR DEVICE

[75] Inventors: Da Y. Wang, Lexington; Daniel T. Kennedy, Burlington; Thomas R. Middleton, Peabody, all of Mass.; Burton W. MacAllister, Hudson, N.H.

[73] Assignee: GTE Control Devices Incorporated, Standish, Me.

[21] Appl. No.: 19,985

[22] Filed: Feb. 17, 1993

Related U.S. Application Data

[63] Continuation of Ser. No. 693,494, Apr. 30, 1991, abandoned.

[51] Int. Cl.⁵ ...................... H01L 23/58; H01L 29/66

[52] U.S. Cl. .............................. 257/467; 338/22 SD; 219/541; 252/520; 437/187

[58] Field of Search ...................... 357/25, 26, 27, 67, 357/65; 437/187, 247, 248; 252/520; 257/467, 734; 219/541; 338/22 R, 22 SD

[56] References Cited

U.S. PATENT DOCUMENTS

| | | | |
|---|---|---|---|
| 3,637,531 | 1/1972 | Faxon et al. | 252/520 |
| 3,975,307 | 8/1976 | Matsuo et al. | 252/520 |
| 4,232,214 | 11/1980 | Shioi et al. | 252/520 |
| 4,261,764 | 4/1981 | Narayan | 437/187 |
| 4,430,255 | 2/1984 | Yan | 252/520 |
| 4,483,933 | 11/1984 | Kobayashi et al. | 252/520 |
| 4,528,613 | 7/1985 | Stetson et al. | 252/520 |
| 4,535,064 | 8/1985 | Yoneda | 252/520 |
| 4,544,828 | 10/1985 | Shigenobu et al. | 252/520 |
| 4,831,432 | 5/1989 | Hori et al. | 357/65 |
| 4,895,812 | 1/1990 | Wang et al. | 437/187 |

*Primary Examiner*—Rolf Hille
*Assistant Examiner*—Minhloan T. Tran
*Attorney, Agent, or Firm*—Martha Ann Finnegan

[57] ABSTRACT

A method of making a positive temperature coefficient of resistance (PTCR) device,and the PTCR device itself, where there is provided a ferroelectric semiconductor having a Curie point and a bulk resistance. A layer of electrically conducting material is provided upon the ferroelectric semiconductor. The layer is heated at a process temperature greater than the Curie point of the ferroelectric semiconductor for a period of time. End cooled to ambient temperature. The process temperature and time period are selected to be sufficient to provide an ambient layer resistance greater than the bulk resistance of the ferroelectric semiconductor. The layer may be heated in an oxidizing atmosphere or in a reducing atmosphere which also affects the layer resistance. The ferroelectric semiconductor may be in the form of an oxide ceramic or liquid crystals, and may include barium titanate. The layer may be selected from the group consisting of metal, metal alloys, metal oxides, polymers, and composites thereof.

1 Claim, 4 Drawing Sheets

PTCR DEVICE

This is a continuation of copending U.S. patent application Ser. No. 07/693,494, filed on Apr. 30, 1991, now abandoned.

FIELD OF THE INVENTION

This invention relates to PTCR devices and in particular to methods of making semiconducting ferroelectric PTCR devices.

BACKGROUND OF THE INVENTION

Positive temperature coefficient of resistance (PTCR) devices can be used for temperature sensing, heat sensing, current sensing, liquid level sensing, generating heat, regulating the temperature for other devices: and voltage clamping and current suppression to provide circuit protection for other devices.

Most PTCR devices are based on the grain boundary PTCR effect. If the bulk materials are ceramics such as barium titanate based ferroelectric semiconductor material, the devices are fabricated by standard solid state reaction methods, with the powders cold-pressed and sintered at high temperatures. Usually, the ceramic devices have additives such as Sr, Zr, Ca, Pb to control the Curie point: Y, Sb to impart the semiconducting properties: with Fe, Cu, and Mn, to enhance the bulk PTCR effect.

The disadvantage of a PTCR device based on the grain boundary PTCR effect is that the device is bulky and difficult to integrate with other electronic devices into a monolithic forms.

It is desirable to provide a new method for making a device wherein the PTCR effect is at electrode level, and which can be easily integrated into other electronic devices for various applications.

U.S. Pat. No. 4,895,812, "Method of Making Ohmic Contact to Ferroelectric Semiconductors", teaches a method for making ohmic contacts to ferroelectric semiconductors. The patent teaches that an electrode material, which can be any electronically conductive material as long as it is thermal-chemically and thermal-mechanically stable with the semiconducting substrate material, is layered on the substrate. The layer is heated to a temperature higher than the Curie point. Upon cooling, the resulting electrode is ohmic to the ferroelectric semiconductor, as the electrode resistance is lower than the bulk resistance. No mention or suggestion is made of a PTCR effect.

SUMMARY OF THE INVENTION

A method of making a PTCR device, and the PTCR device itself, where there is provided a ferroelectric semiconductor having a Curie point and a bulk resistance. A layer of electrically conducting material is provided upon the ferroelectric semiconductor. The layer is heated at a process temperature greater than the Curie point of the ferroelectric semiconductor for a period of time, and cooled to ambient temperature. The process temperature and time period are selected to be sufficient to provide an ambient layer resistance greater than the bulk resistance of the ferroelectric semiconductor. The layer may be heated in an oxidizing atmosphere or in a reducing atmosphere. The ferroelectric semiconductor may be in the form of an oxide ceramic or liquid crystals, and may include barium titanate. The layer may be selected from the group consisting of metal, metal alloys, metal oxides, polymers, and composites thereof.

DETAILED DESCRIPTION OF THE PREFERRED EMBODIMENTS

Figure 1:
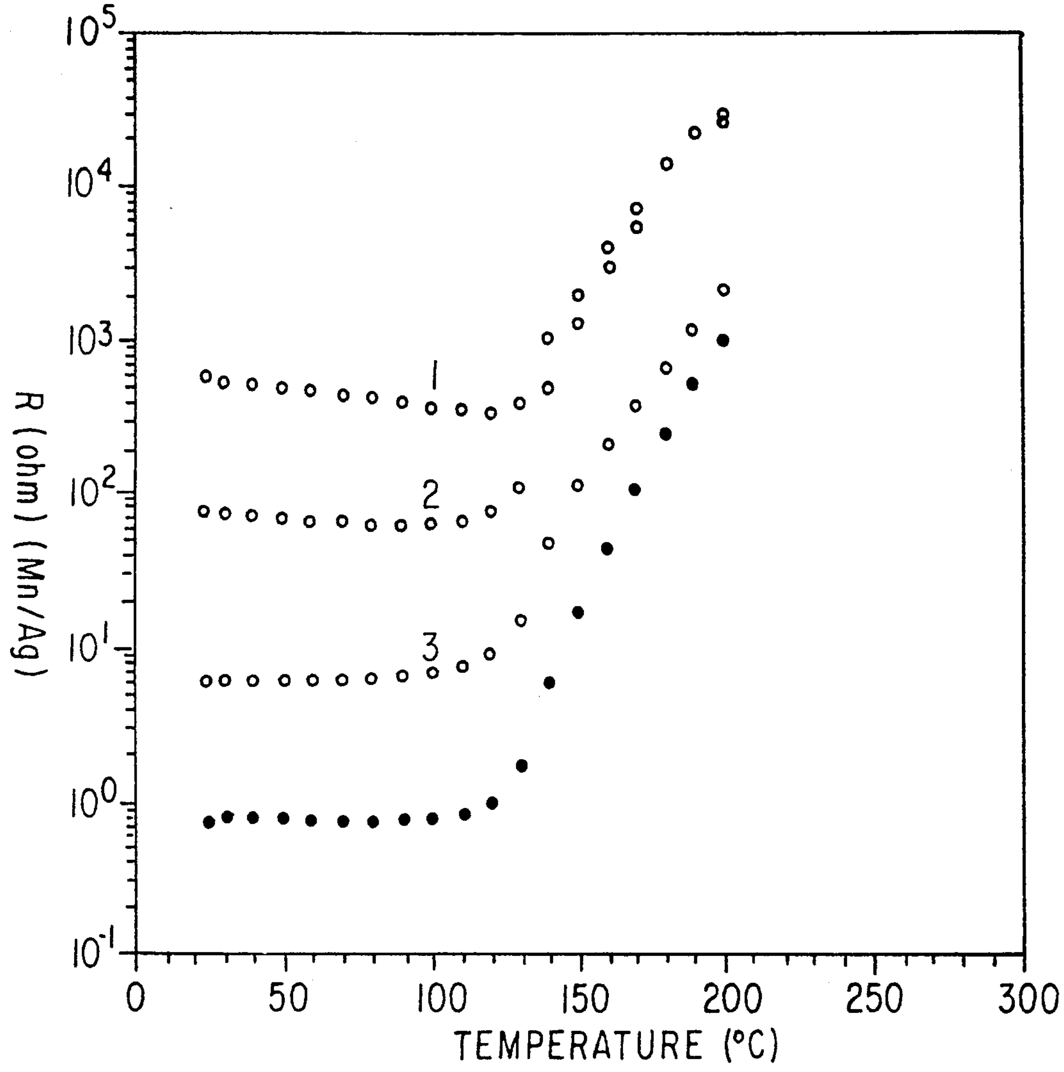
FIG. 1 is a set of curves taken on a PTCR device made as described in the first example below.

By following the method of the invention, one skilled in the art will be able to manufacture an ohmic contacting and a PTCR (positive temperature coefficient resistor) electrode to a ferroelectric semiconductor with the electrode-resistance changing several orders of magnitude near the transition point (the Curie point) of the substrate material.

A basic PTCR electrode device is composed of two electrodes and a substrate. The substrate material has to be semiconducting ferroelectric material, preferably barium titanate based oxides. The substrate can be single crystal or polycrystal, and can be ceramic, or thick film, or thin film. If the substrate material is based on barium titanate, it usually has additives such as Sr, Zr, Ca, Pb to control the Curie point: Y, La, Sb, to impart the semiconducting properties; Fe, Cu, and Mn, to enhance the PTCR effect.

The electrodes are deposited on the surface of the substrate with a layout to be determined by the specific application. The deposition of the electrodes can be done by any method. To improve the adhesion properties of the electrode and to have long temperature-cycle life of the device, the electrode material can have additives of non-noble elements that are mechanically soft and form oxides easily: or have thin-film of such elements sandwiched between the electrode and the substrate material; or have low-melting oxide materials added into the electrode material. Another method to form good adhesion is to use element or alloys (such as Ag, Pt, and their alloys) as the electrode materials and fire at high temperature to form bonding directly with the substrate material (such as firing Ag electrodes at 940° C. for half an hour in open air).

As a feature of the invention the resistance value of the PTCR electrode device is made greater than the bulk resistance of the substrate after the PTCR electrode of the device is deposited. The device is heated in air to a process temperature which is usually higher than the operation temperature of the device. Afterwards, the device is brought down to room, i.e. ambient, temperature. The change of the device resistances is controlled by selecting the process temperature which the device is exposed to and the cooling rate so that the resistance of a PTCR electrode is at a level greater than that of the substrate bulk resistance. Both the process temperature and time as well as ambient atmosphere controls the resistance values of a PTCR electrode device.

When the PTCR electrode device is annealed in a highly oxidized atmosphere (such as air, Cl or Fl) the PTCR resistance is kept high. When annealed in a reducing atmosphere (such as $H_2$ containing atmosphere). the opposite effect happens and the resistance of the PTCR electrode device is reduced. The ambient atmosphere used is not limited to air and hydrogen-mixed gas; it can be fluorine or chlorine containing gas mixture.

The following Examples are presented to enable those skilled in the art to more clearly understand and practice the present invention. These Examples should not be considered as a limitation upon the scope of the present invention, but merely as being illustrative and representative thereof. In each example the substrate material of the samples were regular PTCR semiconducting ferroelectric ceramics with the PTCR electrodes either vacuum deposited or screen-printed on the surfaces of the ceramics. The substrate material of the devices had a composition of $Ba_{0.868}Ca_{0.13}Y_{0.004}TiO_3$ and was fabricated by known ceramic processing technique. The sintering was done in air at 1350° C. for ½ an hour. To enhance the sintering, the ceramic had 0.4 weight % of $SiO_2$ added. The sintered samples were disc-shape and had a diameter of 1.35 cm and a thickness of 0.1 cm. Two electrodes can be deposited on opposite sides of the disc samples. To demonstrate the PTCR electrode effect, only one side of the samples was used for PTCR electrode and the other side was for an In-Ga electrode, which is an ohmic contacting material, to the semiconducting barium titanate. The ohmic electrode was applied to the sample after the thermal treatment of the PTCR electrode was completed.

EXAMPLE 1

The PTCR electrode was prepared by the vacuum deposition method. One side of the samples was first deposited with a thin layer of Mn with a thickness of 5000 Å. On top of that, a thick layer of silver or gold was deposited. The samples were subjected to various temperature treatments in air and the resistances of the samples were measured afterwards. The results were plotted in FIG. 1. The temperature treatments for the three curves in FIG. 1 were:

Curve 1. sample was annealed at 500° C. in air for 10 minutes and furnace cooled (cooling rate is about 100° C./h). Curve 2, sample was annealed at 500° C. in air for 10 minutes and furnace cooled. Afterwards, the sample was heated to 200° C. and cooled to room temperature with a rate of 30° C. per minute.

Curve 3, sample was annealed at 450° C. in air for 10 minutes and furnace cooled to 210° C. and taken out from the furnace for further cooling.

For comparison the bulk resistance of the samples was represented by the dark circles in FIG. 1; the bulk resistance data was obtained by using In-Ga electrodes on both sides of the sample.

EXAMPLE 2

Silver paste was the electrode material. The silver paste contained small amounts of Bi. The electrode was screen-printed on one side of the samples and dried in air at 150° C. for 15 minutes. The samples were subjected to various temperature treatments and the resistances of the samples were measured later. The results were plotted in FIG. 2. The temperature treatments for the four curves in FIG. 2 were:

Curve 1, sample was annealed at 900° C. in air for 20 minutes and furnace cooled.

Curve 2, sample was annealed at 900° C. in air for 20 minutes and furnace cooled. Later, the sample was heated to 475° C. and removed from the furnace and allowed to be cooled by air.

Curve 3, sample was annealed at 800° C. in air for 30 minutes and furnace cooled.

Curve 4, sample was annealed at 800° C. in air for 30 minutes and furnace cooled. Later the sample was heated to 515° C. and removed from the furnace and allowed to be cooled by air.

Figure 2:
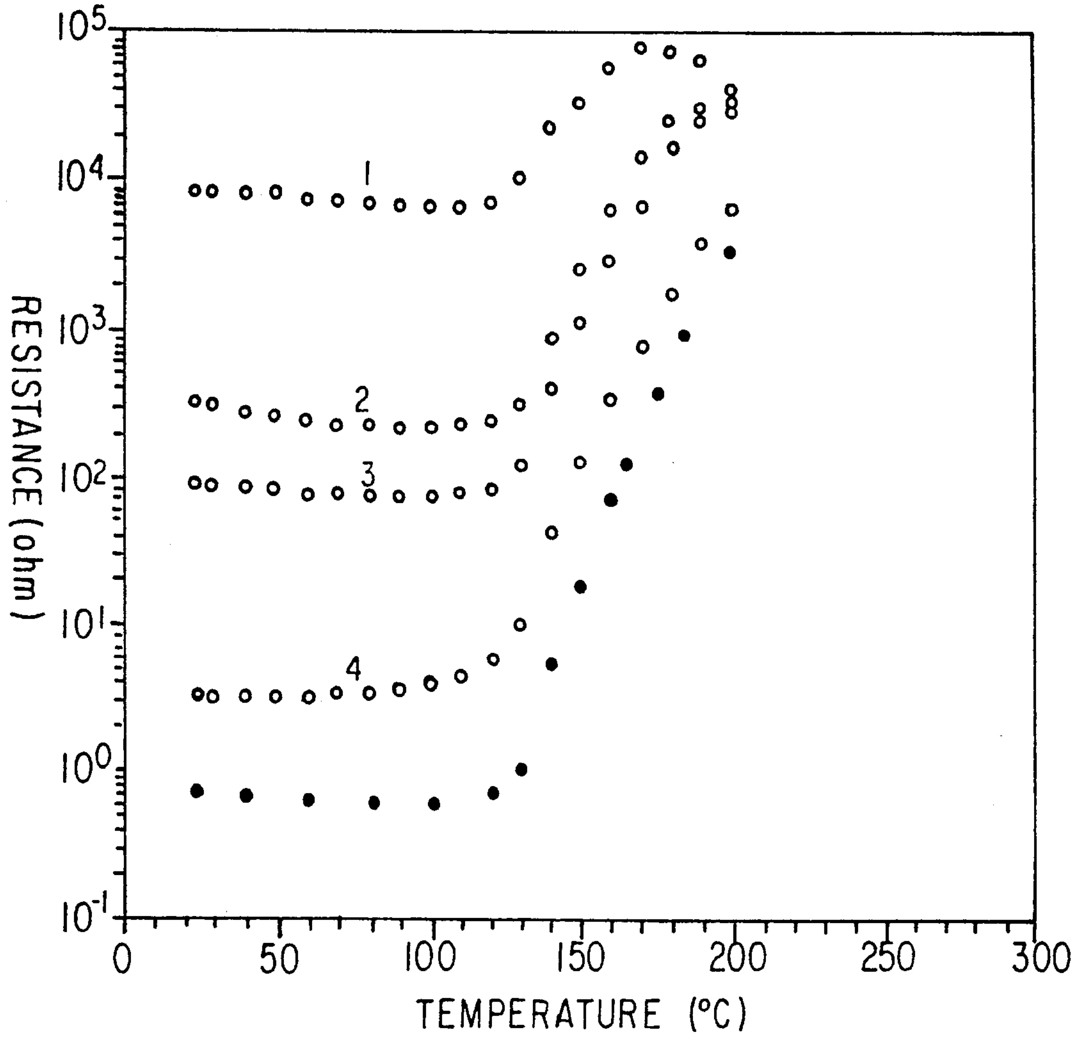
FIG. 2 is a set of curves taken on a PTCR device made as described in the second example below.

For comparison, the bulk resistance of the samples was represented by the dark circles in FIG. 2; the bulk resistance data was obtained by using In-Ga electrodes on both sides of the sample.

EXAMPLE 3

Platinum paste was the electrode material. The platinum paste had slight amounts of Bi, Mn added to improve the adhesion. The Pt paste was screen-printed on one side of the samples and air-dried at 150° C. for 15 minutes. Then, the samples were subjected to various temperature-atmosphere treatments and the resistances of the samples were measured later. The results were plotted in FIG. 3. The temperature treatments for the four curves in FIG. 3 were:

Curve 1, sample was annealed at 1250° C. in air for 10 minutes and furnace cooled.

Curve 2, sample was annealed at 1250° C. in air for 10 minutes and furnace cooled. Later, the sample was annealed at 400° C. in 4% hydrogen and in nitrogen for 5 minutes and furnace cooled. Then, the sample was annealed in air at 800° C. for half an hour and furnace cooled.

Curve 4. sample was annealed at 1250° C. in air for 10 minutes and furnace cooled. Later, the sample was annealed at 350° C. in 4% hydrogen and in nitrogen for 30 minutes and furnace cooled.

Figure 3:
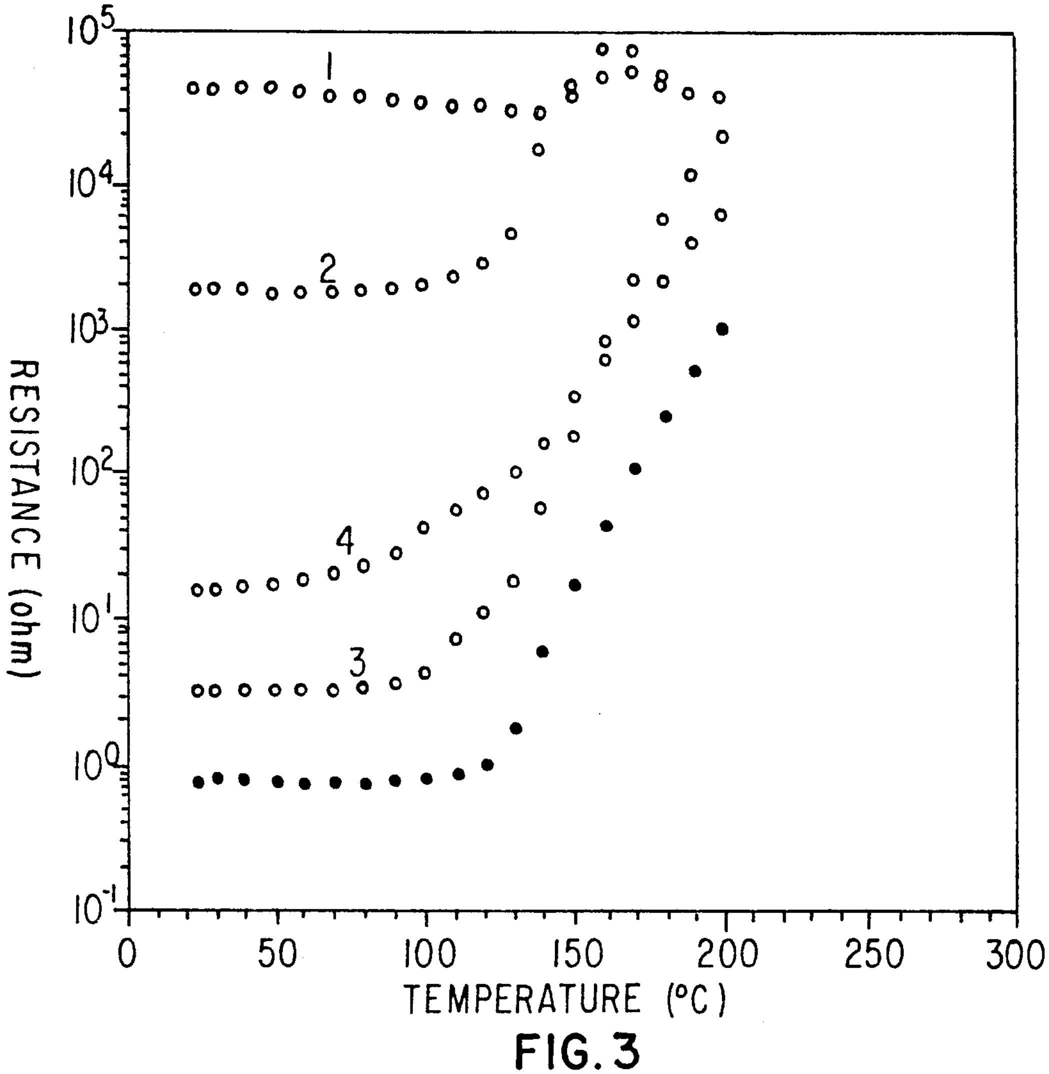
FIG. 3 set of curves taken on a PTCR device made as described in the third example below.

For comparison, the bulk resistance of the samples was represented by the dark circles in FIG. 3; the bulk resistance data was measured with In-Ga electrodes on both sides of the sample.

Figure 4A:
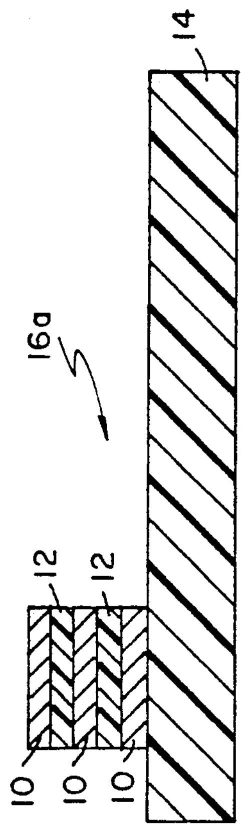
FIGS. 4*a*, 4*b*, and 4*c* are schematic representations of PTCR devices according to the invention.
Figure 4B:
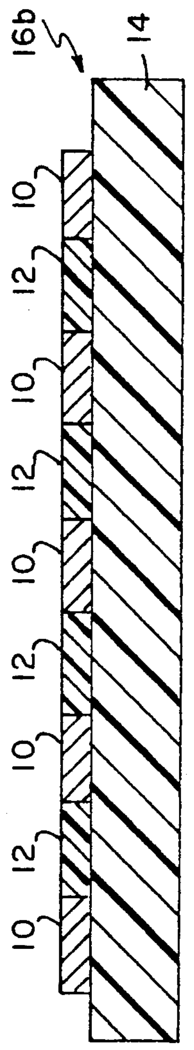
Figure 4C:
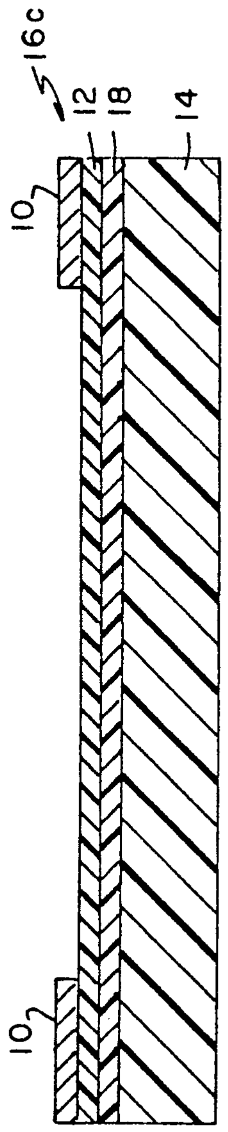

As seen in FIG. 4*a*, 4*b*, and 4*c*, the physical structure of the PTCR device is not limited to the two electrode disc configuration used in the three examples. It can be thick film or thin film type. It can be deposited on top of another substrate material such as silicon wafer, or liquid crystal display panel, or GaAs wafer, or a ceramic substrate, or a SAW substrate (surface acoustic wave device). The deposition of the device can be carried out by screen-printing method, Sol-Jel method, ac or dc sputtering method, MOCVD method.

FIG. 4*a* shows electrodes 10 and barium titanate substrates 12 sequentially deposited on substrate 14 to form PTCR device 16*a*. As mentioned above, substrate 14 may be, e.g., a liquid crystal display panel or a wafer of Si or GaAs. In FIG. 4*b*, electrodes 10 and barium titanate substrates 12 are deposited as adjacent single layers on substrate 14 to form PTCR device 16*b*. In FIG. 4*c*, two electrodes 10 are deposited on a single layer barium titanate substrate 12, which in turn has been deposited on substrate 14 (using buffer layer 18) to form PTCR device 16*c*.

The method has the additional advantage that the PTCR electrode resistance change can be fine-tuned by adjusting the precossing temperature, the precossing time, and the concentration of the gas.

While there has been shown and described what are at present considered the preferred embodiments of the invention, it will be obvious to those skilled in the art that various changes and modifications can be made therein without departing from the scope of the invention as defined by the following claims.

We claim:

1. A positive temperature coefficient of resistance device comprising:

a substrate of ferroelectric semiconductor material comprising a barium titanate based oxide, said substrate having a bulk resistance; and a positive temperature coefficient of resistance electrode comprising a layer of electrically conducting material deposited on a surface of said substrate, said electrode having a resistance greater than said substrate bulk resistance.

* * * * *